US010788546B2

(12) United States Patent
Bilbao De Mendizabal (10) Patent No.: US 10,788,546 B2
(45) Date of Patent: Sep. 29, 2020

(54) MAGNETIC SENSOR WITH INTEGRATED SOLENOID

(71) Applicant: Melexis Technologies SA, Bevaix (CH)

(72) Inventor: Javier Bilbao De Mendizabal, Zurich (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 68 days.

(21) Appl. No.: 16/171,612

(22) Filed: Oct. 26, 2018

(65) Prior Publication Data

US 2019/0128974 A1     May 2, 2019

(30) Foreign Application Priority Data

Oct. 27, 2017    (EP) ..................................... 17198726

(51) Int. Cl.
     *G01R 33/038*      (2006.01)
     *G01R 33/00*      (2006.01)

(52) U.S. Cl.
     CPC ....... *G01R 33/038* (2013.01); *G01R 33/0017* (2013.01); *G01R 33/0035* (2013.01)

(58) Field of Classification Search
None
See application file for complete search history.

(56) References Cited

U.S. PATENT DOCUMENTS

| 5,831,431 | A | 11/1998 | Gottfried-Gottfried et al. |
| 6,404,192 | B1 | 6/2002 | Chiesi et al. |
| 6,545,462 | B2 | 4/2003 | Schott et al. |
| 7,622,367 | B1 | 11/2009 | Nuzzo et al. |
| 8,506,867 | B2 | 8/2013 | Menard |
| 8,889,485 | B2 | 11/2014 | Bower |

(Continued)

FOREIGN PATENT DOCUMENTS

| EP | 2823327 A1 | 1/2015 |
| EP | 3367067 A1 | 8/2018 |

(Continued)

OTHER PUBLICATIONS

Cok et al., "AMOLED Displays with Transfer-Printed Integrated Circuits," Journal of the SID, vol. 19, No. 4, 2011, pp. 335-341.

(Continued)

*Primary Examiner* — Jas A Sanghera
(74) *Attorney, Agent, or Firm* — Workman Nydegger (57) ABSTRACT

A magnetic sensor device comprises a substrate having a surface and a magnetic sensor. A plurality of magnetic cores is disposed on, over, below or in direct contact with a substrate surface, at least one of the magnetic cores having an electrical conductor helically wound around the core forming a coil having a coil length. Each magnetic core is separated from any other magnetic core by a gap length. A current passing through the one or more coils generates a magnetic field. The plurality of cores and gaps form at least one closed magnetic circuit along which the generated magnetic field flux passes, and the total length of the at least one closed magnetic circuit is at least twice the total length of the plurality of gaps of the at least one closed magnetic circuit through which the at least a portion of the magnetic field flux passes.

16 Claims, 6 Drawing Sheets

(56) References Cited

U.S. PATENT DOCUMENTS

| | | |
|---|---|---|
| 9,030,198 B2 | 5/2015 | Schatz et al. |
| 9,520,537 B2 | 12/2016 | Bower et al. |
| 2015/0042325 A1 | 2/2015 | Snoeij et al. |
| 2015/0316638 A1 | 11/2015 | Yamashita et al. |
| 2015/0371756 A1 | 12/2015 | Sturcken et al. |
| 2016/0093600 A1 | 3/2016 | Bower et al. |
| 2016/0299200 A1 | 10/2016 | Taylor et al. |

FOREIGN PATENT DOCUMENTS

| | | |
|---|---|---|
| EP | 3467528 A1 | 4/2019 |
| JP | 63187159 A * | 8/1988 |
| JP | S63187159 A | 8/1988 |
| JP | H0894728 A | 4/1996 |
| JP | 2004325352 A | 11/2004 |

OTHER PUBLICATIONS

Kamberger et al., "Hollow Microcoils Made Possible with External Support Structures Manufactured with a Two-Solvent Process," Journal of Micromechanics and Microengineering, vol. 26, 2016, 8 Pages.

Grecki et al., "Technologies of Current Sensors Suitable for Hot High Density Power Electronics," 13th International Power Electronics and Motion Control Conference, 2008, pp. 1440-1445.

Extended European Search Report from EP Application No. 17198726.6, dated May 8, 2018.

European Search report from European Application No. EP17198726.6, dated Apr. 2, 2020.

\* cited by examiner

MAGNETIC SENSOR WITH INTEGRATED SOLENOID

FIELD OF THE INVENTION

The present invention relates to integrated magnetic sensors incorporating one or more solenoids.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall effect sensors that generate an output voltage proportional to an applied magnetic field or magneto-resistive materials whose electrical resistance changes in response to an external magnetic field. In many applications, it is desirable that magnetic sensors are small and are integrated with electronic processing circuitry so as to reduce the overall magnetic sensor size and provide improved measurements and integration into external electronic systems. For example, U.S. Patent Publication No 20160299200 describes a Hall effect magnetic sensor for measuring magnetic fields incorporating an integrated circuit formed in a semiconductor material on a substrate, together with insulation and adhesion layers.

U.S. Pat. No. 6,545,462 describes a sensor for the detection of the direction of a magnetic field having magnetic flux concentrators and Hall elements. The Hall elements are arranged in the area of the edge of the magnetic field concentrator.

Other magnetic systems are integrated with an electrically conductive coil, for example a wire wrapped in a helix, forming a solenoid. By applying an electrical current to the solenoid, a magnetic field is formed. The volume within a solenoid surrounded by the electrical conductor helix is conventionally termed a core. Various solenoids can have different materials within the helix, for example an air core or a ferromagnetic core such as iron. The use of a ferromagnetic core increases the magnitude of the magnetic flux density in the solenoid, concentrating the magnetic field. A manufacturing process and structure for a hollow micro-coil with an air core supported on the inside surface of a cylinder is described in "Hollow microcoils made possible with external support structures manufactured with a two-solvent process", by Kamberger et al published in the Journal of Micromechanics and Microengineering, Apr. 25, 2016 doi: 10.1088/0960-1317/26/6/065002.

U.S. Pat. No. 5,831,431 illustrates a miniaturized coil arrangement for the detection of magnetically permeable materials. In this design, a core is provided in or parallel to a plane of the substrate and a coil wound around a section of the core so that at least a portion of the coil extends out of the substrate plane. In contrast, U.S. Pat. No. 6,404,192 discloses an integrated planar magnetic sensor with an excitation coil formed in a planar winding made using integrated circuit techniques on a semiconductor substrate. Flat detection coils are provided in different arrangements. U.S. Patent Publication No. 2015/0316638 also describes a planar coil.

Solenoids can be integrated with magnetic sensors. EP2823327 describes a magnetic sensor having an integrated planar coil and a sensing element centered in the coil. The coil produces a magnetic field that is detected by the sensing element; changes in the magnetic field are produced by the presence of a ferromagnetic target. U.S. Pat. No. 9,030,198 discloses a magnetic field sensor and manufacturing method. It includes an excitation coil with a center line oriented perpendicularly to a substrate surface. EP2823327 teaches a magnetic sensor having a ring-shaped ferromagnetic core mounted on a surface of a semiconductor chip. Exciter coils are formed by a combination of conductors on the semiconductor surface beneath the core and wire bonds formed over the top of the core.

Measurements from magnetic sensors can drift over time, providing varying measurements even when exposed to the same magnetic field. For example, the magnetic field measurements can be offset from a desired nominal value, the sensitivity can vary so that measurements are a multiple (either greater or less than one) of the desired value, or both. Moreover, the responsiveness and sensitivity of some magnetic sensors including magnetically permeable materials can change and can be reset by imposing a magnetic field on the magnetic sensor. Furthermore, the magnetic sensor measurements can be deleteriously affected by external objects or stray magnetic fields near the magnetic sensor There is a need therefore, for space-efficient and small structures and effective methods to operate and test magnetic sensors under a wide range of environmental conditions and in the presence of undesired magnetic objects or stray magnetic fields.

SUMMARY OF THE INVENTION

It is an object of the present invention to provide magnetic sensors having increased functionality and/or sensitivity in a reduced form factor and/or with reduced susceptibility to environmental noise and/or with improved manufacturability.

Embodiments of the present invention provide a magnetic sensor device comprising a substrate having a surface, a magnetic sensor disposed on, over, below, or in direct contact with the surface, the magnetic sensor being configured for detecting a magnetic field, a plurality of magnetic cores disposed on, over, below or in direct contact with the substrate surface, at least one of the magnetic cores having an electrical conductor helically wound around the core forming a coil having a coil length and each magnetic core separated from any other magnetic core by a gap having a gap length. The one or more coils are configured for, when a current passes through said one or more coils, generating a magnetic field wherein at least a portion of the generated magnetic flux passes through at least a portion of the magnetic sensor, of the plurality of cores, and of the plurality of gaps forming at least one closed magnetic circuit along which the generated magnetic field flux passes, and wherein the total length of the at least one closed magnetic circuit is at least twice the total length of the plurality of gaps of the at least one closed magnetic circuit through which the at least a portion of the magnetic flux passes. A magnetic field line that forms a closed loop and passes through the one or more solenoids, the plurality of cores, the plurality of gaps and the one or more magnetic sensors, referred to as a magnetic circuit. Where a plurality of closed magnetic circuits are present, the condition that the total length of the at least one closed magnetic circuit is at least twice the total length of the plurality of gaps of the closed magnetic circuit may be fulfilled for one of these closed magnetic circuits, for some of the closed magnetic circuits or for each of the closed magnetic circuits. Thus, in embodiments of the present invention, for at least one magnetic circuit and preferably for more or even for all magnetic circuits, the magnetic flux can pass a greater distance through the magnetic cores than outside the magnetic cores.

In some embodiments, for at least one closed magnetic circuits formed by a magnetic sensor, the plurality of cores and the plurality of gaps, the total length of the one or more coils in the closed magnetic circuit is larger than the total length of the plurality of gaps in the closed magnetic circuit. Where reference is made to the total length of the one or more coils, reference is made to the length of the coil when only a single coil is provided and to the sum of the lengths of the coils where multiple coils are provided. Where reference is made to the total length of the plurality of gaps, reference is made to the length of the gap when a single gap is present and to the sum of the lengths of the gap where multiple gaps are present.

The magnetic sensor can be disposed at least partially in the gap, beneath at least one of the cores, or adjacent to the gap and between at least a portion of a core and the substrate. The magnetic sensor can be an XMR sensor disposed at least partially in the gap or at least partially in the center of the gap, or the magnetic sensor can be a vertical or horizontal hall-plate sensor disposed between a magnetic core and the substrate.

One or more of the magnetic core can be a ferromagnetic core or other magnetically permeable material. The one or more solenoids can be a single solenoid with a single core. The single solenoid can have two opposing ends on opposite sides of the magnetic sensor and can form a C-shaped structure in a plane parallel to the substrate surface. In a further embodiment, the magnetic sensor device includes additional cores that are not located within a coil.

A magnetic core wrapped with a coil forms a solenoid. In an embodiment of the present invention, the magnetic sensor device includes a plurality of solenoids. The solenoids can be electrically connected in common or can be electrically separate. Each core of the solenoids can have a proximal end adjacent to the magnetic sensor and a distal end on a side of the solenoid opposite the proximal end. The proximal end can be, but is not necessarily, smaller than the distal end. The multiple solenoids can be distributed regularly around a magnetic sensor or a magnetic core, can each be adjacent to a different magnetic sensor, or adjacent edges of the multiple solenoids can be spaced apart by a common distance.

Two solenoids and/or magnetic cores can have a common center line or can have center lines that are not parallel. The center line can be parallel to the substrate surface or extend at an angle less than or equal to 45, 30, 20, 10, or 5 degrees with respect to the substrate surface.

The magnetic sensor can be at least partially disposed in a common plane with a portion of the one or more solenoids or with a portion of the core(s) and the common plane can be substantially parallel to the substrate surface. Alternatively, the magnetic sensor is disposed between the one or more solenoids and at least a portion of the substrate in a direction perpendicular to the substrate surface.

The substrate can include an electronic control circuit that controls the magnetic sensor, the one or more solenoids, or both. The electronic circuit can operate the magnetic sensor to measure a magnetic field, can operate the one or more solenoids to provide a test magnetic field, and can operate the one or more solenoids to provide a recalibration magnetic field.

The circuit can provide current to all of the one or more solenoids at the same time or to less than all of the solenoids at the same time, for example every other solenoid in a circular arrangement of solenoids. In an embodiment, a plurality of coils is electrically connected in common, electrically connected in series, electrically connected in parallel, or electrically connected in separate groups of coils where the coils in a group are electrically connected in series and the groups or coils are electrically connected in parallel. In an embodiment, electrical current can pass through one group of coils and through another group of coils in an opposite direction. The circuit can provide current to coils on opposite sides of the magnetic sensor or a magnetic core and not to others of the solenoids at the same time. The circuit can sequentially provide power to one or a group of solenoids and subsequently provide current to another one or group of solenoids to enable measurements of magnetic fields having field lines with different directions.

In another embodiment, groups of solenoids are driven with a current in one direction and another group of solenoids are driven with a current in an opposite direction. For example, in a circular arrangement of an even number of solenoids, the odd and even solenoids are driven in opposite directions. In another embodiment, a coil or group of coils can be driven with a current in one direction at one time and at another time the same coil or group of coils can be driven with the same or a different current in an opposite direction. This mode of operation can be useful for magnetic sensor calibration. Reversing the current enables the cancellation of an external magnetic field while extracting the calibration signal. For example, a second measurement subtracted from a first measurement can equal the external magnetic field at the time of the first measurement plus the magnetic field of the first measurement of the coil minus the external magnetic field at the time of the second measurement minus the magnetic field of the second measurement of the coil (Bext1+Bcoil1−Bext2−Bcoil2=2*Bcoil1).

In an embodiment, the coils can be used to generate a magnetic field in a closed loop operation. In an embodiment, the deviation (or error) due to sensitivity drift in a magnetic sensor is typically larger when the magnetic field component to be measured is larger, for example it has a larger amplitude, and is smaller when the magnetic field component to be measured is smaller, for example has a smaller amplitude. In some embodiments, the effect of long-term sensitivity mismatch is reduced (or in some embodiments even eliminated) by reducing the magnetic field to be measured. More specifically, one or more local magnetic fields are created by applying one or more currents I1, I2, etc. to specific solenoids arranged in the close vicinity of the magnetic sensors in order to reduce, but preferably to completely compensate, the external magnetic field "Bext".

The one or more solenoids can provide a magnetic field at the magnetic sensor location greater than or equal to 1 mT, 3 mT, 5 mT, 10 mT, 15 mT, 20 mT, or 50 mT.

In one aspect, the present invention also relates to a method of use of the magnetic sensor device as described above in situations where magnetic sensors need to be operated and/or tested under a wide range of environmental conditions and/or in the presence of undesired magnetic objects or stray magnetic fields.

Embodiments of the present invention provide magnetic sensor devices having improved functionality and reduced size, can operate, test, and recalibrate magnetic sensors, and can have a reduced susceptibility to environmental noise.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF PARTICULAR EMBODIMENTS OF THE INVENTION

Embodiments of the present invention can be used in position sensors and methods for position sensing as described for example in EP17158425 entitled "Position Sensor and Method of Position Sensing", filed Feb. 28, 2017, the contents of which is incorporated herein by reference.

Embodiments of the present invention provide magnetic sensors having increased functionality and sensitivity in a reduced form factor, with reduced susceptibility to environmental noise, and with improved manufacturability.

Figure 1A:
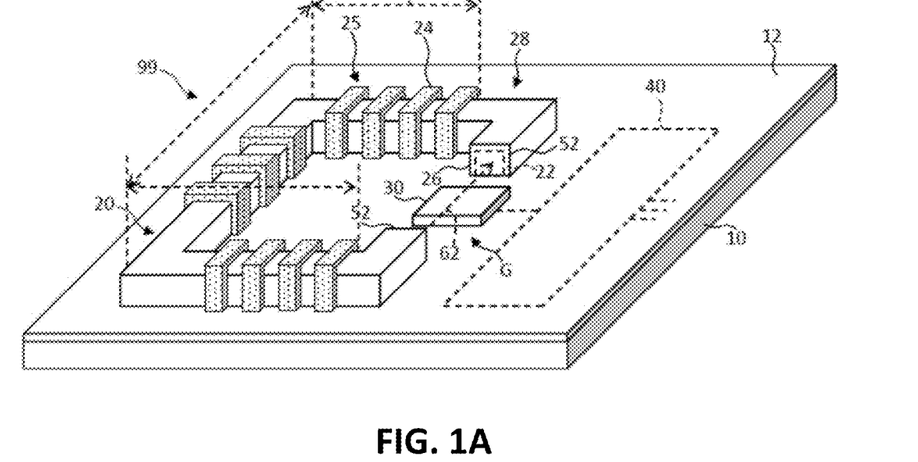
FIG. 1A is a perspective of an embodiment of the present invention.
Figure 1B:
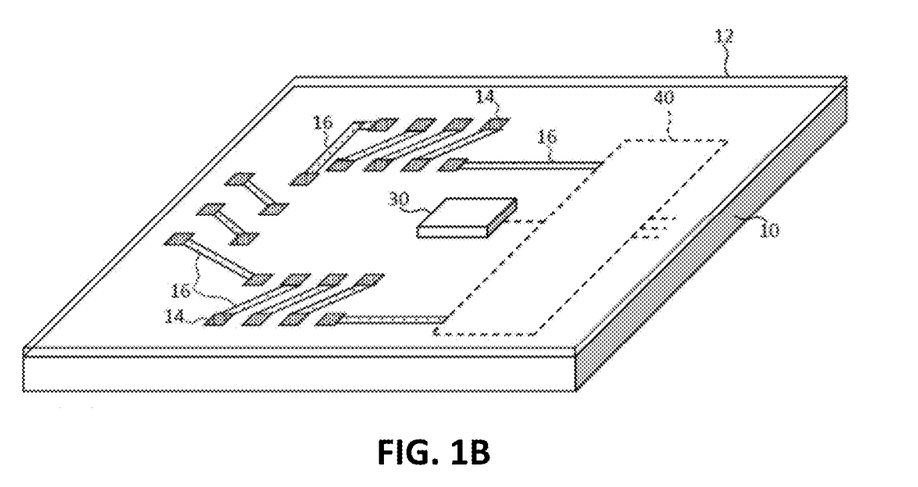
FIG. 1B is a cut-away perspective of FIG. 1A with the solenoid removed.
Figure 1C:
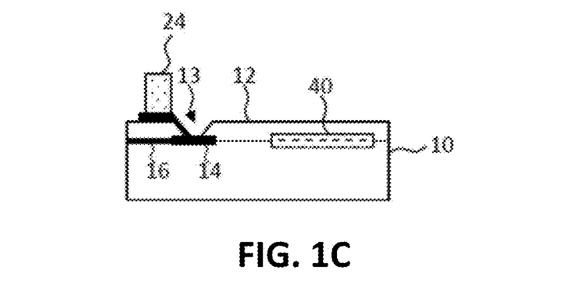
FIG. 1C is a detail cross section of a contact pad and circuit of FIG. 1B.

Referring to FIG. 1A to FIG. 1C, a magnetic sensor device 99 comprises a substrate 10 having one or more surfaces. A magnetic sensor 30 for detecting a magnetic field is disposed on, over, below, or in the substrate 10 surface. A plurality of magnetic cores 22 are disposed on, in, or over the substrate 10 surface. At least one of the magnetic cores 22 has an electrical conductor 24 helically wound around a magnetic core 22 forming a coil 25 having a coil length 60. Each magnetic core 22 is separated from any other magnetic core 22 by a gap G having a gap length 62. A current passing through the one or more coils 25 generates a magnetic field at least a portion of whose magnetic flux passes through at least a portion of the magnetic sensor 30, one or more coils 25, and the plurality of gaps G forming at least one closed magnetic circuit along which the generated magnetic field flux passes. The total length of the at least one closed magnetic circuit is at least twice the total length of the plurality of gaps of the at least one closed magnetic circuit through which the at least a portion of the magnetic flux passes. In some embodiments, the sum of the coil lengths 60 (or the length of the single coil if there is a single coil) in the closed magnetic circuit is greater than the sum of the gap lengths 62 (or the length of the single gap if there is a single gap) of the plurality of gaps in the closed magnetic circuit through which the at least a portion, for example at least 30%, at least 50%, or at least 80%, of the magnetic flux passes. The magnetic flux passing through the coil 25 can also pass through a magnetic core 22 around which the coil 25 is wrapped. A magnetic core 22 and coil 25 surrounding the magnetic core 22 form a solenoid 20. In an embodiment, the magnetic sensor device 99 includes a magnetic core 22 that does not have a coil 25 wound around the magnetic core 22.

In one embodiment, the magnetic sensor 30 is located at least partially within the gap G in a direction parallel to the substrate 10 surface. Alternatively, or in addition, the magnetic sensor 30 is located between a magnetic core 22 and the substrate 10, is located below a magnetic core 22, is located adjacent to the gap G, is located partially or completely in the gap G, or is located between at least a portion of a magnetic core 22 and the substrate 10. By adjacent to the gap G is meant that the magnetic sensor 30 is the closest magnetic sensor 30 to the gap G. In embodiments, the magnetic sensor 30 is formed in or on the substrate 10 or is a separate integrated circuit disposed on the substrate 10.

In other embodiments, a plurality of magnetic sensors 30 are included and can be disposed on different surfaces of the substrate 10, for example on opposite sides of the substrate 10.

When provided with an electrical current through the coil 25, for example from a magnetic sensor device controller having an electronic control circuit 40 electrically connected to the coil 25 through wires, the one or more solenoids 20 forms a magnetic field whose magnetic flux (magnetic field lines) generated by a current passing through the helically wound electrical conductor 24 (the coil 25) substantially passes through at least a portion of the magnetic sensor 30 and can be detected by the magnetic sensor 30. By substantially is meant that the magnetic sensor 30 can detect the magnetic field. The generated magnetic field can be constant over time, environment, or changes in circumstance or use as long as the current through the coil 25 is constant. In a further embodiment of the present invention, the magnetic sensor device 99 includes additional magnetic cores 22 that are not located within a coil 25 as part of a solenoid 20.

Each coil 25 has a coil length 60 defined by the length of a center line passing through the coil 25, for example substantially at the center of a cylindrical space about which the coil 25 is wrapped. The center line can be at the center of the magnetic core 22 around which the electrical conductor 24 is wrapped. The center line does not have to be a straight line but can comprise line segments, as shown in FIG. 1A to FIG. 1C. The coil length 60 is a length through a magnetic core 22 about which the coil 25 is wrapped. Each gap G has a gap length 62 defined by the distance separating two magnetic cores 22. The gap length 62 is a length that is not through the magnetic cores 22.

The substrate 10 can be one of many substrates with a surface capable of supporting or receiving the magnetic sensor 30 and solenoids 20, for example a glass, plastic, ceramic, or semiconductor substrate with two opposing relatively planar and parallel sides. The substrate 10 can have a variety of thicknesses, for example 10 microns to several millimeters. The substrate 10 can be a portion or surface of another device and can include electronic circuitry, for example electronic control circuit 40. Alternatively, the electronic control circuit 40 can be provided in a separate integrated circuit mounted on or adjacent to the substrate 10 surface. The magnetic sensor 30 can be any of a variety of magnetic sensors, for example a Hall effect sensor or magneto-resistive sensor. The magnetic sensor 30 can be provided in an integrated circuit or in a circuit formed or disposed on, in, or in direct contact with the substrate 10, a surface of the substrate 10, or a layer on the substrate 10.

Figure 2A:
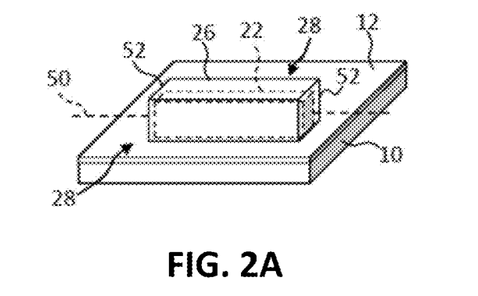
FIG. 2A is a detail perspective of a solenoid core structure according to an embodiment of the present invention.
Figure 2B:
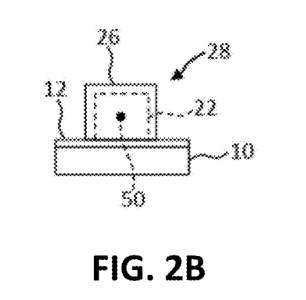
FIG. 2B is a cross section of the perspective of FIG. 2A taken orthogonally to the center line.

The solenoids 20 comprise an electrical conductor 24 helically wrapped in a coil 25 (a helix) around a magnetic core 22. The electrical conductor 24 can be a metal conductor (e.g., a metal wire, such as copper, aluminum, tungsten, silver, gold, titanium, tin, or other metals or metal alloys) or any material that conducts electricity. The solenoids 20 make a magnetic field when provided with electrical current through the coil 25. The magnetic core 22 can be any of a variety of substances, for example a ferromagnetic material (e.g., iron). Because ferromagnetic materials can themselves conduct electricity, the core magnetic 22 can be insulated from the electrically conductive coil 25 with a core insulator 26, as also shown in the perspective of FIG. 2A and the cross section of FIG. 2B (excluding the electrical conductors 24 for clarity). The magnetic core 22 and the core insulator 26 together form a core structure 28. The core insulator 26 can be coated or disposed over the magnetic core 22 (as shown). In another embodiment, the core insulator 26 is provided around the electrical conductors 24 (wires) of the coil 25 (not shown in FIG. 2B), or only in the location of the electrical conductors 24 over the magnetic core 22, and can include a portion of an insulating dielectric layer 12 disposed over the substrate 10. The core insulator 26 can be any of a variety of insulators, for example a plastic, a resin, an oxide such as silicon dioxide, or a nitride such as silicon nitride. The solenoid 20 or magnetic core 22 can be adhered to a surface of the substrate 10 or embedded in a layer on the substrate 10, for example disposed or embedded in the dielectric layer 12 provided on the substrate 10. The dielectric layer 12 can be a polymer or other insulator such as silicon dioxide. The dielectric layer 12 can be a cured adhesive, such as SU8.

The magnetic core 22 of each solenoid 20 extends along the length of each solenoid 20, where the length is the longest dimension of the solenoid 20, or extends in the direction of a center line 50 at the center of each magnetic core 22. Each magnetic core 22 has an end 52, for example at the greatest extent of the length. The end 52 can have a surface that can be, but is not necessarily, orthogonal to the center line of the coil 25 or magnetic core 22 or can be, but is not necessarily, planar. The center line 50 can be the intersection of the diagonals or the centroids of cross sections of the solenoid 20 magnetic core 22 taken perpendicularly to the length, taken parallel to one or both of the end 52 surfaces, or taken perpendicularly to a side of the magnetic core 22. According to embodiments of the present invention, the two ends 52 of the magnetic sensor device 99 face each other, for example their centerlines 50 intersect both of the two end 52 surfaces or a plane containing at least a portion of the end 52 surfaces. The end 52 surfaces can be orthogonal to, or at least not parallel to, the surface of the substrate 10.

The center line 50 of the entire magnetic core 22 is not necessarily a geometrically straight line in a plane. In the example of FIG. 1A to FIG. 1C, the solenoid 20 forms a block C shape in a plane parallel to the substrate 10 and the center line 50 (not shown for clarity) has five segments, two of which have or are the same line (those center lines 50 extending from the faces of the ends 52 of the magnetic core 22).

In an embodiment, the magnetic sensor 30 is located at least partially between two ends 52 of the one or more solenoids 20 separated by a gap G in a direction parallel to the substrate 10 surface. The two ends 52 can have opposing faces disposed on opposite sides of the magnetic sensor 30 and can be opposite ends 52 of a single solenoid 20 with a single magnetic core 22, as shown in FIG. 1A. In another embodiment, the magnetic sensor 30 is located adjacent to or in the gap G and between at least a portion of a solenoid 20 and the substrate 10.

FIG. 1B is a cut-away illustration of an embodiment of the present invention corresponding to FIG. 1A with the solenoid 20 removed. As shown, at each point where the electrical conductors 24 of the coil 25 contact the substrate 10 or a layer (e.g., dielectric layer 12) on the substrate 10, a substrate contact 14 is disposed that forms an electric connection to the corresponding electrical conductor 24 of the coil 25. Adjacent substrate contacts 14 are electrically connected on opposing sides of the solenoid 20 location with substrate conductors 16 to connect the electrical conductors 24 in a helical coil 25. Thus, electrical signals sent from the electronic control circuit 40 through a substrate conductor 16 to a first substrate contact 14 pass through the first substrate contact 14 into an electrical conductor 24 of the coil 25, pass through a first electrical conductor 24 of the coil 25 over the magnetic core 22 to the other side of the solenoid 20, enter a second substrate contact 14 and pass into a second substrate conductor 16, pass under the solenoid 20 into a third substrate contact 14, into a second electrical conductor 24 of the coil 25 and over the magnetic core 22, again, and so on, until the electrical signal is returned through a substrate conductor 16 to the electronic control circuit 40. As shown in FIG. 1C, the electrical conductor 24 (and the magnetic core 22, not shown) is insulated from the substrate conductors 16 by the dielectric layer 12. Thus, vias 13 formed in the dielectric layer 12 over the substrate contacts 14 enable contact between the electrical conductors 24 and the substrate conductors 16.

Figure 8:
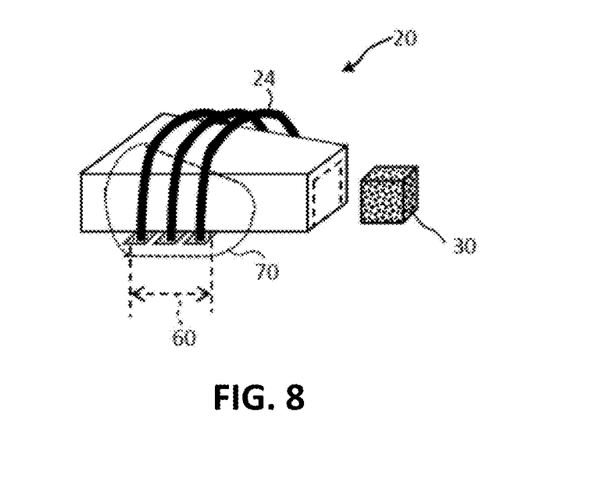
FIG. 8 is a perspective illustrating a solenoid, magnetic circuit, and magnetic sensor.

Referring to FIG. 8, a solenoid 20, when provided with electrical current through its coil 25, creates a magnetic field with magnetic field lines. An infinite number of magnetic circuits 70 are formed and pass through the solenoid 20 when the electrical conductors 24 of the coil 25 are provided with electrical current. The magnetic circuit 70 will have a length larger than the coil length 60 since it at least passes through the coil 25. As shown in FIG. 8, the magnetic circuit 70 has a length larger than twice the coil length 60 since the magnetic circuit 70 passes through the coil 25, out of the magnetic core 22 at one end 52 of the solenoid 20, around the solenoid 20 outside the magnetic core 22, and back into the magnetic core 22 at the other end 52 of the solenoid 20. In the illustration of FIG. 8, a majority of the magnetic circuit 70 length is outside a magnetic core 22 but the magnetic circuit 70 does not extend into the magnetic sensor 30 so that the magnetic field cannot be sensed. Extending the length of the coil 25 can locate the magnetic field lines closer or into the magnetic sensor 30 but can be difficult for manufacturing reasons and finer wires needed for additional turns of the coil 25 can reduce current-carrying capacity of the coil 25 and hence the strength of the magnetic field.

In contrast, and according to embodiments of the present invention, magnetic flux in a magnetic circuit 70 generated by a current passing through the coil 25 passes through at least a portion of the magnetic sensor 30, passes through one or more coils 25, and passes through one or more gaps G. The sum of the coil lengths 60 is greater than the sum of the gap lengths 62 through which the at least a portion of the magnetic flux in a magnetic circuit 70 passes. Thus, according to embodiments of the present invention, a majority of the magnetic circuit 70 length is in a magnetic core 22 and the magnetic sensor 30 is disposed between two magnetic cores 22 so that the magnetic circuit 70 passes through the magnetic sensor 30.

Moreover, portions of magnetic circuits 70 that pass through free space rather than through a magnetic core are more subject to noise from external objects or stray magnetic fields. By reducing the portion of the magnetic circuits 70 that are not in a magnetic core 22, whether or not the magnetic core 22 is wrapped by a coil 25, the magnetic field sensed by the magnetic field sensor 30 is more reliable and consistent in a wider variety of environments.

Figure 3A:
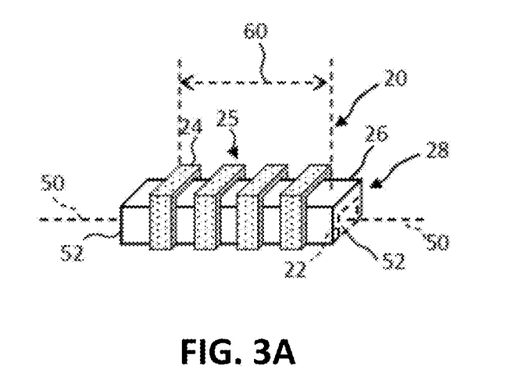
FIG. 3A is a perspective of a solenoid according to an embodiment of the present invention.
Figure 3B:
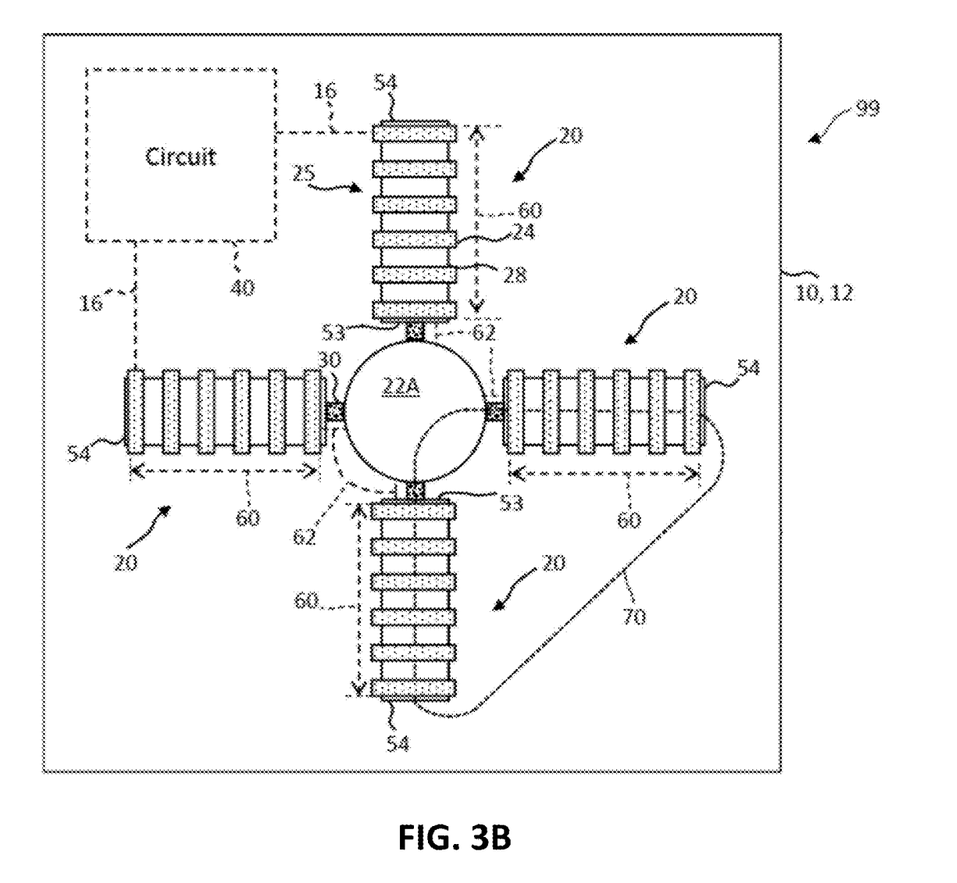
FIG. 3B is a plan view of an embodiment of the present invention incorporating a plurality of the solenoids of FIG. 3A.

The embodiment of the invention illustrated in FIG. 1A has a single solenoid 20 with two opposing faces on the ends 52 of the solenoid 20 and the gap length 62 is less than the coil length 60 of the C-shaped solenoid 20 and even less than the distance the magnetic circuit 70 passes through a magnetic core 22. In an alternative embodiment and referring to FIGS. 3A and 3B, a plurality of solenoids 20 are disposed on, over, or in contact with the substrate 10 or layers (e.g., dielectric layer 12) on the substrate 10 and a plurality of magnetic sensors 30 are likewise disposed on, over, or in contact with the substrate 10 or layers (e.g., dielectric layer 12) on the substrate 10. Moreover, a magnetic core 22A that does not have a coil 25 is disposed at the center of the arrangement of solenoids 20. As shown in the FIG. 3A perspective, each core structure 28 (including the magnetic core 22 and any core insulator 26) has two opposing ends 52. As shown in FIG. 3B, a proximal end 53 is adjacent to the magnetic core 22A and a magnetic sensor 30 and a distal end 54 is on an opposite side or opposite end of the solenoid 20 magnetic core 22. Thus, the proximal end 53 is closer to the magnetic sensor 30 and the magnetic core 22A than the distal end 54. The proximal end 53 and the distal end 54 are the same size. The two ends 52 of the magnetic sensor device 99 are the proximal ends 53 of different cores 22 and possibly of different solenoids 20. When neighboring pairs of solenoids 20 disposed at right angles to each other are supplied with electrical current, they form magnetic circuits 70 that pass through the magnetic core 22A and have a length that passes mostly through the magnetic cores 22 and 22A. This allows that the same flux goes/flows over the at least two sensors. These at least two sensors having the same flux variation allow for safe power consumption and also allow for sensor calibration matching more accurately, since both sensors sense the same flux.

Figure 4A:
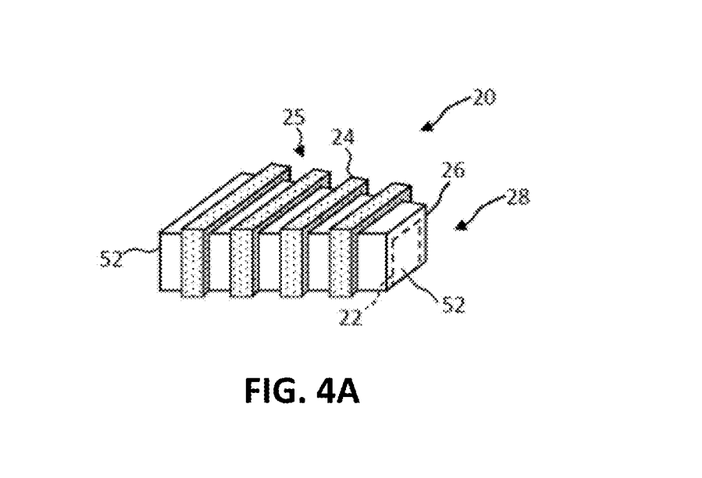
FIG. 4A is a perspective of a solenoid according to an embodiment of the present invention.
Figure 4B:
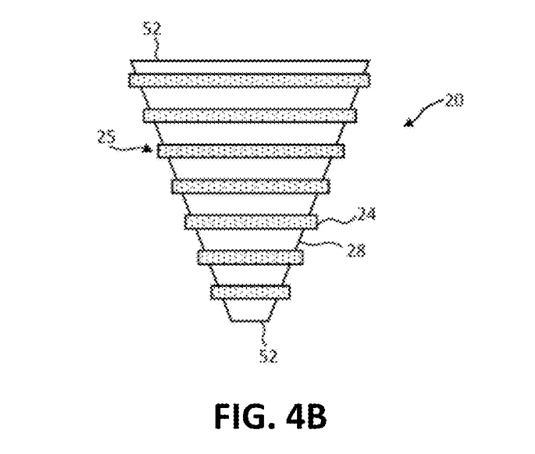
FIG. 4B is a plan view of the solenoid of FIG. 4A.
Figure 4C:
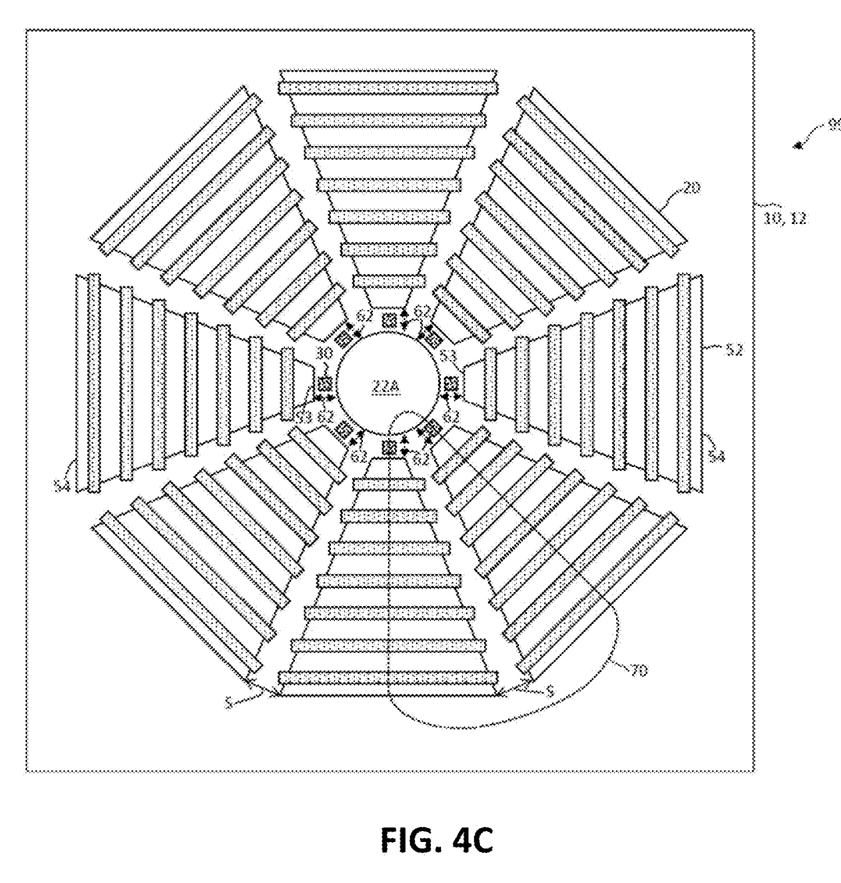
FIGS. 4C and 4D are plans view of alternative embodiments of the present invention incorporating a plurality of the solenoids of FIGS. 4A and 4B and a magnetic core.
Figure 4D:
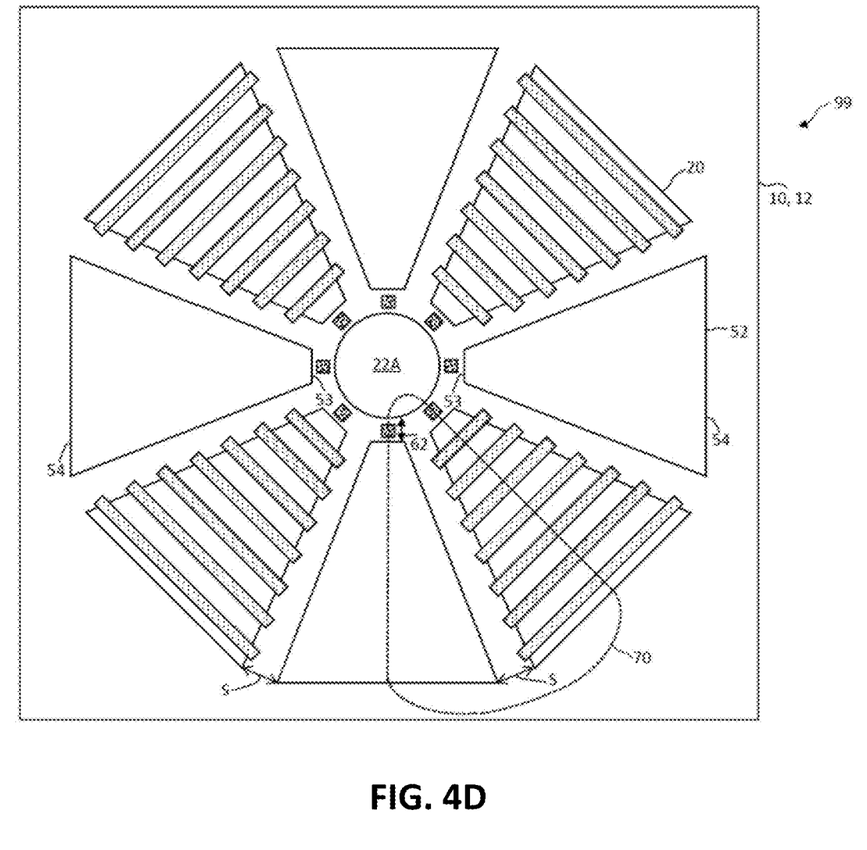

In another embodiment and referring to FIGS. 4A, 4B, 4C, and 4D, a plurality of solenoids 20 are disposed on, over, or in contact with the substrate 10 or layers on the substrate 10 (FIGS. 4C and 4D). As shown in the FIG. 4A perspective and the FIG. 4B plan view, each core structure 28 (including the magnetic core 22 and any core insulator 26) has two opposing ends 52. As shown in FIG. 4C, each proximal end 53 is adjacent to a magnetic sensor 30 and a distal end 54 is on an opposite side of the solenoid 20 so that the proximal end 53 is closer to the magnetic sensor 30 than the distal end 54 and the two ends 52 of the magnetic sensor device 99 are the proximal ends 53 of different magnetic cores 22 and possibly of different solenoids 20. In this embodiment, the proximal end 53 is smaller than the distal end 54, for example has a smaller area.

In the embodiments of FIGS. 4C and 4D, each solenoid 20 has a proximal end 53 facing the magnetic sensor 30 and separated by the gap G from a magnetic core 22A or magnetic core 22 on an opposite side of the magnetic sensor 30, so that the solenoids 20 have least two facing proximal ends 53 separated by a gap G from the magnetic core 22A with the magnetic sensor 30 at least partially within the gap G in a direction parallel to the substrate 10 surface. When neighboring pairs of adjacent solenoids 20 are supplied with electrical current, they form magnetic circuits 70 that pass through the magnetic core 22A and magnetic cores 22 of the solenoids 20 and that have a length that passes mostly through the magnetic cores 22 and 22A, thereby reducing the magnetic sensor 30 susceptibility to noise or interference.

In an embodiment of the present invention, the magnetic sensor device 99 has two solenoids 20 on opposite sides of the magnetic core 22A and the two solenoids 20 can have a common center line. In another embodiment of the present invention, the magnetic sensor device 99 has two solenoids 20 at an angle to each other, for example 90 degrees (FIGS. 4A, 3B), so that the two solenoids 20 have center lines 50 (not shown) that are not parallel and the magnetic sensor 30 is disposed where the center lines 50 (not shown) of the solenoids 20 cross each other. In that embodiment, the proximal ends 53 face each other at the angle and the gap G is the sum of the distances between the proximal ends 53 and the magnetic core 22A and the distal ends 54. In yet another embodiment, the multiple solenoids 20 are distributed regularly around the magnetic core 22A, as shown in FIGS. 3B, 4C, and 4D. Adjacent edges of the multiple solenoids 20 can be spaced apart by a common distance S and the center lines 50 (not shown) of the multiple solenoids 20 can intersect at the location of the magnetic core 22A.

The solenoids 20 in the plurality of solenoids 20 can be electrically connected in common, for example in series or in parallel, and operate at the same time in response to the same signal. In such an embodiment, the solenoids 20 in the plurality of solenoids 20 can also be considered as a single solenoid 20 with multiple magnetic cores 22. Alternatively, each solenoid 20 in the plurality of solenoids 20 can be electrically separate and controlled separately from any of the other solenoids 20 with separate electrical control signals, for example provided by the electronic control circuit 40. In yet another embodiment, solenoids 20 in different groups of solenoids 20 in the plurality of solenoids 20 are electrically connected in common, for example in series or in parallel, and the groups of solenoids 20 are electrically separate and controlled separately from any of the other solenoids 20 with separate electrical control signals, for example in series or in parallel. In one embodiment, the solenoids 20 are electrically connected in separate groups of solenoids 20 where the solenoids 20 in a group are electrically connected in series and the groups of solenoids 20 are electrically connected in parallel.

In other embodiments, even solenoids 20, odd solenoids 20, or pairs of opposing solenoids 20 are operated at the same time. In yet another embodiment groups of solenoids 20 are driven with a current in one direction and another group of solenoids are driven with a current in an opposite direction. For example, in a circular arrangement of an even number of solenoids 20, the odd solenoids 20 are driven in an opposite direction from the even solenoids 20. The embodiment of FIG. 4D has an arrangement of eight solenoids 20. The even solenoids 20 (arbitrarily selected as the top, bottom, left and right solenoids 20) are driven with a current in a forward direction to make a magnetic field with a positive direction (for example a right-hand field) and the odd solenoids 20 (arbitrarily selected as the solenoids 20 oriented at a 45-degree angle) are driven with a current in a reverse direction to make a magnetic field with a negative direction (for example a left-hand field). The odd and even solenoids 20 can be driven in opposite directions at the same time controlled by the electronic control circuit 40.

As shown in the embodiment of FIG. 4D, only a portion of the cores 22 are incorporated into solenoids 20. The magnetic cores 22 serve to constrain the magnetic field in the cores, so that the magnetic field lines (magnetic flux) pass through the magnetic sensor(s) 30, e.g. at least 10% of the magnetic field lines, e.g. at least 30% of the magnetic field lines, e.g. at least 50% of the magnetic field lines, e.g. at least 70% of the magnetic field lines, e.g. at least 90% of the magnetic field lines such as e.g. 100% of the magnetic field lines.

Figure 5:
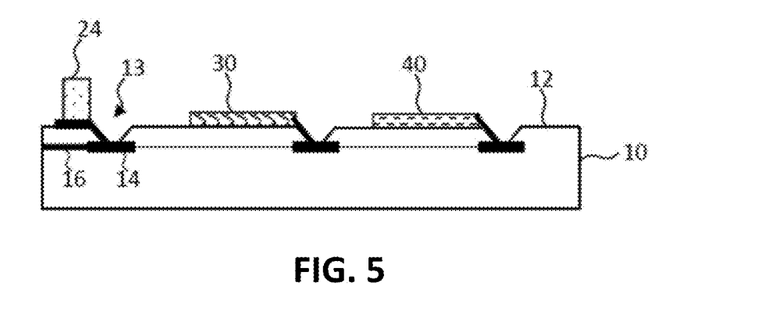
FIGS. 5 and 6 are cross sections according to alternative embodiments of the present invention.

As shown in FIG. 1A and FIG. 5, the magnetic sensor 30 is at least partially disposed in a common plane with a portion of the one or more solenoids 20 or with a portion of the magnetic core(s) 22. For example, in this configuration the magnetic sensor 30 is disposed on a common layer (e.g., dielectric layer 12) with the core structure 28 and the common plane is substantially parallel to the substrate 10 surface. In various configurations, an XMR type magnetic sensor 30 can be at the center of the gap G to sense an in-plane magnetic field or by while horizontal hall plate magnetic sensors 30 can be below a magnetic core 22 or solenoid 20 to sense Bz (where B represents the magnetic field and the descriptor x, y, or z the dimension in which the magnetic field is sensed by the magnetic sensor 30). In various embodiment, the magnetic sensors 30 can sense one, two, or three magnetic field components.

Figure 6:
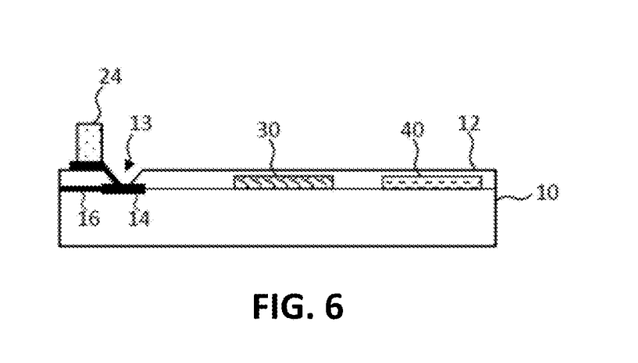

In an embodiment, the magnetic sensor 30, the core structure 28, and the electronic control circuit 40 are disposed on the dielectric layer 12 and electrically connected through vias 13 in the dielectric layer 12 and substrate conductors 16. In a different embodiment and as shown in the cross section of FIG. 6, the magnetic sensor 30 is disposed between the one or more solenoids 20 or portion of the magnetic core 22 and at least a portion of the substrate 10 in a direction perpendicular to the substrate 10 surface so that the magnetic sensor 30 is beneath the solenoid 20, for example under the dielectric layer 12. In either case, the magnetic sensor 30 is at least partly between the ends 52 of the solenoid 20 in a direction parallel to the substrate 10 surface. In another embodiment, the magnetic sensor 30 is not within the gap.

By controlling the electrical current through the coil 25, the electronic control circuit 40 forms a magnetic field that is detected by the magnetic sensor 30. Embodiments of the present invention with a solenoid 20 having at least two facing ends 52 concentrate and provide a stronger magnetic field at the magnetic sensor location. The magnetic sensor 30 can detect changes in the magnetic field, for example due to externally generated magnetic fields or the presence of magnetically sensitive materials, such as ferromagnetic materials. The strong magnetic field provided by embodiments of the present invention enable recalibration of magnetic materials in the magnetic sensor 30.

In an embodiment of the present invention, the magnetic sensor device 99 can be made by providing the substrate 10 and forming substrate conductors 16 and substrate contacts 14 on the substrate 10, together with any necessary vias 13. In one configuration, the electronic control circuit 40 can be made on or in the substrate 10 using at least some of the same processing steps or materials, for example using photolithographic and integrated circuit methods and materials. Alternatively, the electronic control circuit 40, for example an integrated circuit, is micro-transfer printed to the substrate 10 or layers on the substrate 10, for example the dielectric layer 12. The magnetic sensor 30 can also be made on or in the substrate 10 using at least some of the same processing steps or materials, for example using photolithographic and integrated circuit methods and materials or can be micro-transfer printed to the substrate 10 or layers on the substrate 10. Micro-transfer printed cores 22, magnetic sensors 30, or circuits 40 enable a reduced form factor and improved functionality by, at least in part, dispensing with additional packaging.

If the magnetic sensor 30 or electronic control circuit 40 are micro-transfer printed to the substrate 10 or layers on the substrate 10 (e.g., dielectric layer 12, FIG. 5) they can be electrically connected to the substrate conductors 16 as desired through vias 13 in any intervening layers (e.g., dielectric layer 12) as is commonly done in the integrated circuit and printed circuit board arts. Alternatively, the electronic control circuit 40 or magnetic sensor 30 are surface mount devices and disposed using surface mount techniques. In an embodiment, the electronic control circuit 40 is provided externally to the magnetic sensor device 99 and electrically connected to the magnetic sensor device 99 through wires, for example through a ribbon or flex cable.

Figure 7:
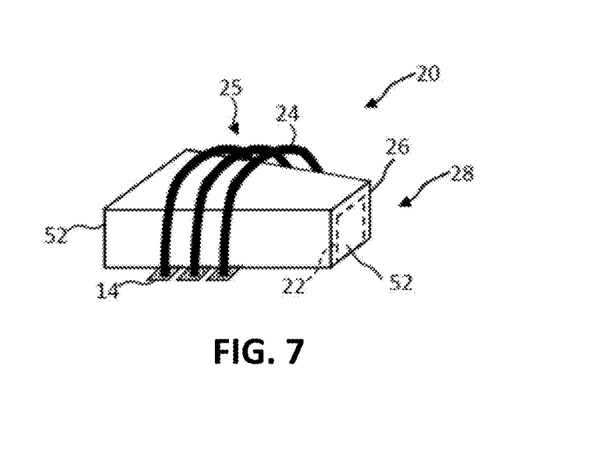
FIG. 7 is a perspective illustrating an alternative solenoid structure according to an alternative embodiment of the present invention.

The magnetic core(s) 22 can be provided, for example in a tape and reel configuration, as surface mount components, or as micro-transfer printable components and disposed over, on, or in direct contact with the substrate 10 or layers on the substrate 10 such as dielectric layer 12, for example using pick-and-place, surface mount, or micro-transfer printing. In one embodiment, the magnetic cores 22 are coated with an insulator to form the core insulation 26 after disposition on the substrate 10, for example by spray or spin coating, by evaporation, or by sputtering, and cured, if necessary. Alternatively, the core structure 28 is micro-transfer printed from a source wafer and disposed on or over the substrate 10 or any layers on the substrate 10. In an embodiment, the electrical conductors 24 are formed lithographically over the core structure 28 and in contact with the substrate contacts 14 by depositing and patterning an electrically conductive material such as metal, as shown in FIG. 1A and FIG. 3A. In an alternative embodiment, referring to FIG. 7, the electrical conductors 24 are provided by wire bonding wires from a first substrate contact 14 on one side of the core structure 28, over the core structure 28 to the other side of the core structure 28, to a second substrate contact 14, to form the helical coil 25. In this embodiment, the wire bonded wires are the electrical conductors 24.

Embodiments of the magnetic sensor device 99 of the present invention can be operated by providing electrical power to the electronic control circuit 40, for example an electronic circuit. The electronic control circuit 40 can control the magnetic sensor 30, the one or more solenoids 20, or both by providing and receiving signals from the magnetic sensor 30 and controlling the flow of electrical current through the solenoids 20, for example individually, together, or in separate groups of solenoids 20. In embodiments of the present invention, the electronic control circuit 40 operates the magnetic sensor 30 to measure a magnetic field, to operate the one or more solenoids 20 to provide a test magnetic field, or to operate the one or more solenoids 20 to provide a recalibration magnetic field for the magnetic sensor 30, or any combination of these functions. In an embodiment, the one or more solenoids 20 provide a magnetic field at the magnetic sensor 30 location greater than or equal to 1 mT, 3 mT, 5 mT, 10 mT, 15 mT, 20 mT, or 50 mT or 100 mT.

In one embodiment, the magnetic sensor device 99 comprises a plurality of solenoids 20 and the electronic control circuit 40 provides current to all of the solenoids 20 at the same time. In another embodiment, the magnetic sensor device 99 comprises a plurality of solenoids 20 and the electronic control circuit 40 provides current to less than all of the solenoids 20 at the same time. In yet another embodiment, the magnetic sensor device 99 comprises a plurality of solenoids 20 and the electronic control circuit 40 provides current to solenoids 20 on opposite sides of the magnetic sensor 30 and not to others of the solenoids 20 at the same time. In a further embodiment, the magnetic sensor device 99 comprises a plurality of solenoids 20 and the electronic control circuit 40 provides current to a group of solenoids 20 at the same time and then subsequently provides current to a different group of solenoids 20 at the same time, for example to measure magnetic fields associated with magnetic field lines having a direction.

Methods of forming micro-transfer printable structures are described, for example, in the paper "AMOLED Displays using Transfer-Printed Integrated Circuits" (Journal of the Society for Information Display, 2011, DOI #10.1889/JSID19.4.335, 1071-0922/11/1904-0335, pages 335-341) and U.S. Pat. No. 8,889,485, referenced above. For a discussion of micro-transfer printing techniques see, U.S. Pat. Nos. 8,722,458, 7,622,367 and 8,506,867, each of which is hereby incorporated by reference in its entirety. Micro-transfer printing using compound micro-assembly structures and methods can also be used with the present invention, for example, as described in U.S. patent application Ser. No. 14/822,868, filed Aug. 10, 2015, entitled "Compound Micro-Assembly Strategies and Devices", which is hereby incorporated by reference in its entirety. In an embodiment, the magnetic sensor device 99 is a compound micro-assembled device. Additional details useful in understanding and performing aspects of the present invention are described in U.S. patent application Ser. No. 14/743,981, filed Jun. 18, 2015, entitled "Micro Assembled LED Displays and Lighting Elements", which is hereby incorporated by reference in its entirety.

In one aspect, the present invention also relates to a method of use of the magnetic sensor device as described above in situations where magnetic sensors need to be operated and/or tested under a wide range of environmental conditions and/or in the presence of undesired magnetic objects or stray magnetic fields.

As is understood by those skilled in the art, the terms "over", "under", "above", "below", "beneath", and "on" are relative terms and can be interchanged in reference to different orientations of the layers, elements, and substrates included in the present invention. For example, a first layer on a second layer, in some embodiments means a first layer directly on and in contact with a second layer. In other embodiments, a first layer on a second layer can include another layer there between. Additionally, "on" can mean "on" or "in."

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The invention claimed is:

1. A magnetic sensor device, comprising:
   a substrate having one or more surfaces;
   a magnetic sensor disposed on, over, below, or in direct contact with one of the one or more surfaces, the magnetic sensor being configured for detecting a magnetic field;
   a plurality of magnetic cores disposed on, over, below or in direct contact with one of the one or more substrate surfaces, at least one of the magnetic cores having an electrical conductor helically wound around the core forming a coil having a coil length and each magnetic core separated from any other magnetic core by a gap having a gap length; and
   wherein said one or more coils are configured for, when a current passes through said one or more coils, generating a magnetic field, wherein at least a portion of the generated magnetic field flux passes through the magnetic sensor, the plurality of cores, and the one or more gaps forming at least one closed magnetic circuit along which the generated magnetic field flux passes, and wherein the total length of the at least one closed magnetic circuit is at least twice the total length of the one or more gaps of the at least one closed magnetic circuit through which the at least a portion of the magnetic field flux passes.

2. The magnetic sensor device according to claim 1, wherein the magnetic sensor is located at least partially in one of the one or more gaps, located beneath at least one of the cores, or located adjacent to one of the one or more gaps and between at least a portion of a core and the substrate.

3. The magnetic sensor device according to claim 1, wherein at least one of the plurality of magnetic cores is a ferromagnetic core.

4. The magnetic sensor device according to claim 1, comprising a magnetic core without a coil wrapped around the magnetic core.

5. The magnetic sensor device according to claim 1, wherein the magnetic sensor is an XMR sensor disposed at least partially in one of the one or more gaps or at least partially in the center of one of the one or more gaps, or wherein the magnetic sensor is a hall-plate sensor disposed between a magnetic core and the substrate.

6. The magnetic sensor device according to claim 1, comprising a plurality of coils electrically connected in common, electrically connected in series, electrically connected in parallel, or electrically connected in separate groups of coils where the coils in a group are electrically connected in series and the groups of coils are electrically connected in parallel, or comprising a plurality of electrically separated coils.

7. The magnetic sensor device according to claim 1, wherein the magnetic sensor is at least partially disposed in a common plane with a portion of the one or more coils or with a portion of the plurality of magnetic cores.

8. The magnetic sensor device according to claim 1,
wherein the magnetic sensor is at least partially disposed in a common plane with a portion of the one or more coils or with a portion of the plurality of magnetic cores, the common plane being substantially parallel to one of the one or more surfaces of the substrate, or
wherein the magnetic sensor is disposed between the one or more coils and at least a portion of the substrate in a direction perpendicular to one of the one or more surfaces of the substrate.

9. The magnetic sensor device according to claim 1, each magnetic core of the plurality of magnetic cores having a proximal end adjacent to the magnetic sensor and a distal end on a side of the magnetic core opposite the proximal end.

10. The magnetic sensor device according to claim 9, wherein the proximal end is smaller than the distal end and
wherein multiple magnetic cores are distributed regularly around a central magnetic core.

11. The magnetic sensor device according to claim 10, wherein adjacent edges of the multiple magnetic cores are spaced apart by a common distance, or
wherein two magnetic cores have a common center line, or
wherein two magnetic cores have center lines that are not parallel.

12. The magnetic sensor device according to claim 1, wherein the substrate includes an electronic circuit that controls the magnetic sensor, current passing through the one or more coils, or both.

13. The magnetic sensor device according to claim 12, wherein the electronic circuit operates the magnetic sensor to measure a magnetic field, operates the one or more coils to provide a test magnetic field, and operates the one or more coils to provide a recalibration magnetic field, or
wherein the magnetic sensor device is comprising a plurality of coils and wherein the electronic circuit provides current to all of the one or more coils at the same time, or
wherein the magnetic sensor device is comprising a plurality of coils and wherein the electronic circuit provides current to less than all of the coils at the same time.

14. The magnetic sensor device according to claim 12, comprising a plurality of coils and wherein the electronic circuit provides current to coils on opposite sides of the magnetic sensor and not to others of the coils at the same time, or
wherein the electronic circuit provides current in a direction to coils in a first group of coils and provides current in an opposite direction to a second group of coils at the same time.

15. The magnetic sensor device according to claim 1, wherein the one or more coils provide a magnetic field at the magnetic sensor location greater than or equal to 1 mT, 3 mT, 5 mT, 10 mT, 15 mT, 20 mT, or 50 mT.

16. The magnetic sensor device according to claim 1, comprising a plurality of magnetic sensors, each magnetic sensor detecting a magnetic field.

* * * * *